US005512502A

United States Patent [19]
Ootsuka et al.

[11] Patent Number: 5,512,502
[45] Date of Patent: Apr. 30, 1996

[54] MANUFACTURING METHOD FOR SEMICONDUCTOR INTEGRATED CIRCUIT DEVICE

[75] Inventors: Fumio Ootsuka, Tokorozawa; Yusuke Nonaka, Ohme; Atsumi Aoki, Hamura, all of Japan

[73] Assignee: Hitachi, Ltd., Tokyo, Japan

[21] Appl. No.: 396,786

[22] Filed: Mar. 1, 1995

[30] Foreign Application Priority Data

Mar. 1, 1994 [JP] Japan .................................. 6-031066
Dec. 16, 1994 [JP] Japan .................................. 6-313838

[51] Int. Cl.$^6$ .................................. H01L 21/265
[52] U.S. Cl. .................................. 437/41; 437/34; 437/51; 437/59; 437/200; 437/247; 148/DIG. 147
[58] Field of Search .................................. 437/41, 34, 49, 437/51, 56, 59, 200, 247; 148/DIG. 147

[56] References Cited

U.S. PATENT DOCUMENTS 4,774,204  9/1988  Havemann .................................. 437/34
5,081,066  1/1992  Kim .................................. 437/200
5,192,992  3/1993  Kim et al. .................................. 437/34
5,341,014  8/1994  Fujii et al. .................................. 437/200

FOREIGN PATENT DOCUMENTS 61-150216  8/1986  Japan .
6140355  5/1994  Japan .................................. 437/200

Primary Examiner—Tuan H. Nguyen
Attorney, Agent, or Firm—Antonelli, Terry, Stout & Kraus

[57]  ABSTRACT

In forming a MISFET having a salicide structure, a polysilicon film forming a gate electrode in the MISFET is constructed of a first silicon film having a high n-type impurity concentration on the side of a gate insulating film and a second silicon film having a low n-type impurity concentration on the surface side of the gate electrode. Further, a Ti film is deposited on the second silicon film. The Ti film and the second silicon film are annealed twice at proper different temperatures to thereby promote a silicide reaction and form a low-resistance silicide layer in the second silicon film.

24 Claims, 10 Drawing Sheets

MANUFACTURING METHOD FOR SEMICONDUCTOR INTEGRATED CIRCUIT DEVICE

BACKGROUND OF THE INVENTION

The present invention relates to a manufacturing method for a semiconductor integrated circuit device, and more particularly to such a method effective when applied to a semiconductor integrated circuit device including a MISFET (Metal Insulator Semiconductor Field Effect Transistor) having a salicide (self-aligned silicide) structure.

As one of the techniques for realizing a high-speed operation of MISFET, there is known a so-called salicide technique such that a high-melting point metal silicide layer having a low resistance is formed on the surfaces of a gate electrode and source and drain regions. Such a salicide technique is described in Japanese Patent Laid-open No. 61-150216 or U.S. Pat. No. 5,081,066, for example.

The method of forming a salicide as described in Japanese Patent Laid-open No. 61-150216 will now be described. First, a polysilicon film deposited over a semiconductor substrate is patterned to form a gate electrode of a MISFET, and then a side wall spacer of silicon oxide is formed on the side wall of the gate electrode. Then, an impurity is introduced into the semiconductor substrate by an ion implantation process with the gate electrode and the side wall spacer being used as a mask, thereby forming source and drain regions in the semiconductor substrate on both sides of the gate electrode.

Then, an insulating film (gate insulating film) on the surfaces of the source and drain regions is removed by etching, and then a titanium (Ti) film is deposited over the surface of the semiconductor substrate by a sputtering process. Then, the semiconductor substrate is annealed to form a Ti silicide layer in the interface between the gate electrode (polysilicon) and the Ti film and in the interface between the source and drain regions (single crystal of silicon) and the Ti film.

The annealing for forming the Ti silicide layer is performed at a relatively low temperature of about 400° to 600° C. in an atmosphere of inert gas. Such a low-temperature annealing is due to the fact that if the annealing is performed at a high temperature, silicon (Si) in the substrate is attracted into the Ti film to also form a silicide layer on the side wall spacer or there occurs a reaction of the Ti film with the silicon oxide film (the side wall spacer), resulting in short-circuit between the gate electrode and the source and drain regions through the Ti silicide layer on the side wall spacer.

However, the Ti silicide ($TiSi_x$; x<2) layer formed by the low-temperature annealing mentioned above has a high resistance (a sheet resistance of about 30 to 40 Ω/sq. at an annealing temperature of 500° C.), which cannot be put to practical use. Accordingly, an unreacted portion of the Ti film left on the side wall spacer and the like is removed by wet etching, and then second annealing is performed at a high temperature of 600° C. or more in an atmosphere of inert gas to reduce the resistance of the Ti silicide layer on the gate electrode and the source and drain regions, thereby obtaining a Ti silicide ($TiSi_2$) layer having a sheet resistance of about 5 to 10 Ω/sq.

Thus in such a conventional salicide process of forming a silicide layer on the gate electrode and the source and drain regions in the MISFET, annealing is performed twice at different temperatures to form a silicide layer having a low resistance.

An n-type impurity such as phosphorus (P) or arsenic (As) is introduced into the polysilicon film forming the gate electrode of the MISFET, so as to reduce the resistance of the gate electrode. The introduction of P or As is performed simultaneously with the deposition of the polysilicon film.

However, if the n-type impurity is introduced at a high concentration into the polysilicon film to reduce the resistance of the gate electrode, the silicide reaction in the interface between the gate electrode (polysilicon film) and the Ti film as mentioned above is hindered. Specifically, when the concentration of the n-type impurity in the polysilicon film is about $2 \times 10^{20}$ atoms/cm$^3$ or more during the deposition, the first silicide reaction (Ti+Si→ $TiSi_x$; x<2) is progressed, but the second silicide reaction ($TiSi_x \rightarrow TiSi_2$) is hindered from being progressed. Accordingly, even when the high-temperature annealing is performed, the silicide layer ($TiSi_x$) having a high resistance remains on the gate electrode, causing an increase in sheet resistance (ρs) of the gate electrode.

Further, the sheet resistance of the gate electrode largely varies with the annealing temperature in performing the second silicide reaction ($TiSi_x \rightarrow TiSi_2$). That is, if the annealing temperature at this time is low, the second silicide reaction is not enough progressed. Accordingly, in a heat treatment process (e.g., reflow and densification of an interlayer insulating film) to be performed after the annealing, there occurs agglomeration in the silicide layer to increase the sheet resistance. Conversely, if the annealing temperature is excessively high, there occurs agglomeration during the course of the silicide reaction to yet increase the sheet resistance.

On the other hand, if the concentration of the n-type impurity in the polysilicon film forming the gate electrode is reduced to avoid the above problem, there occurs another problem such that when a positive voltage is applied to the gate electrode with the semiconductor substrate (well) grounded, a depletion layer is formed in the gate electrode, with the result that an effective thickness of the gate electrode is increased to cause a decrease in drain current in the MISFET.

SUMMARY OF THE INVENTION

It is accordingly an object of the present invention to provide a manufacturing method for a semiconductor integrated circuit device which can form a silicide layer having a low resistance by enough progressing the silicide reaction of a high-melting point metal film deposited on a gate electrode in forming a MISFET having a salicide structure.

The above and other objects and the novel features of the present invention will become apparent from the following description in this specification and the accompanying drawings.

A typical method of the present invention is summarized as follows:

(1) A manufacturing method for a semiconductor integrated circuit device according to the present invention comprises the steps of:

(a) depositing a first silicon film containing an n-type impurity over a semiconductor substrate, and then depositing over the first silicon film a second silicon film containing an n-type impurity at a concentration lower than that of the n-type impurity contained in the first silicon film or substantially not containing an n-type impurity;

(b) patterning the first and second silicon films to form a gate electrode of a MISFET, and then anisotropically etching an insulating film deposited over the semiconductor substrate to form a side wall spacer on the side wall of the gate electrode;

(c) depositing a high-melting point metal (A) film over the semiconductor substrate, and then performing first annealing to form a silicide layer ($ASi_x$; x<2) in the interface between the gate electrode and the high-melting point metal film; and (d) removing an unreacted portion of the high-melting point metal film remaining over the semiconductor substrate, and then performing second annealing at a temperature higher than that of the first annealing to thereby reduce the resistance of the silicide layer.

(2) In the manufacturing method mentioned in (1), the concentration of the n-type impurity in the first silicon film is set to $2\times10^{20}$ atoms/cm$^3$ or more; the concentration of the n-type impurity in the second silicon film is set to $1\times10^{20}$ atoms/cm$^3$ or less; and the concentration of the impurity in the interface between the silicide layer reduced in its resistance and the second silicon film is set to $1\times10^{20}$ atoms/cm$^3$ or less.

(3) In the manufacturing method mentioned in (1), the thickness of the second silicon film is set to a value twice or more of the thickness of the high-melting point metal film.

(4) In the manufacturing method mentioned in (2), the temperature of the second annealing is set within the range of 800° to 900° C.

According to the present invention mentioned above, the concentration of the n-type impurity in the silicon film forming a surface side of the gate electrode is made low to thereby well promote the silicide reaction in the interface between the silicon film and the high-melting point metal film.

Furthermore, the concentration of the n-type impurity in the silicon film forming a gate insulating film side of the gate electrode is made high to thereby suppress the formation of a depletion layer in the gate electrode. Accordingly, an increase in effective thickness of the gate insulating film can be prevented.

DETAILED DESCRIPTION OF THE PREFERRED EMBODIMENTS

A preferred embodiment of the present invention will now be described in detail with reference to the drawings.

This preferred embodiment is an embodiment applied to a CMISFET (Complementary MISFET) wherein gate electrodes in an n-channel MISFET and a p-channel MISFET are formed of n-type polysilicon films. A manufacturing method for the CMISFET will be described with reference to FIGS. 1 to 21.

Figure 1:
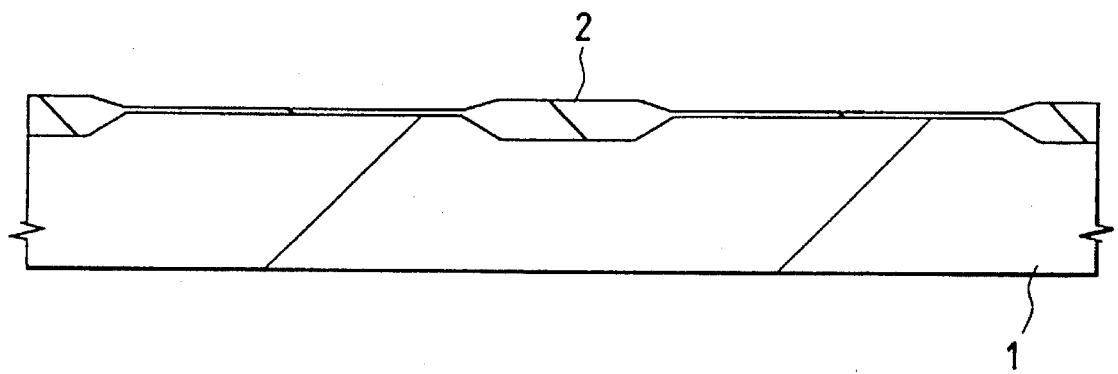
FIGS. 1 to 14, 19, and 20 are sectional views of an essential part of a semiconductor substrate, showing a manufacturing method for a semiconductor integrated circuit device according to a preferred embodiment of the present invention.
Figure 2:
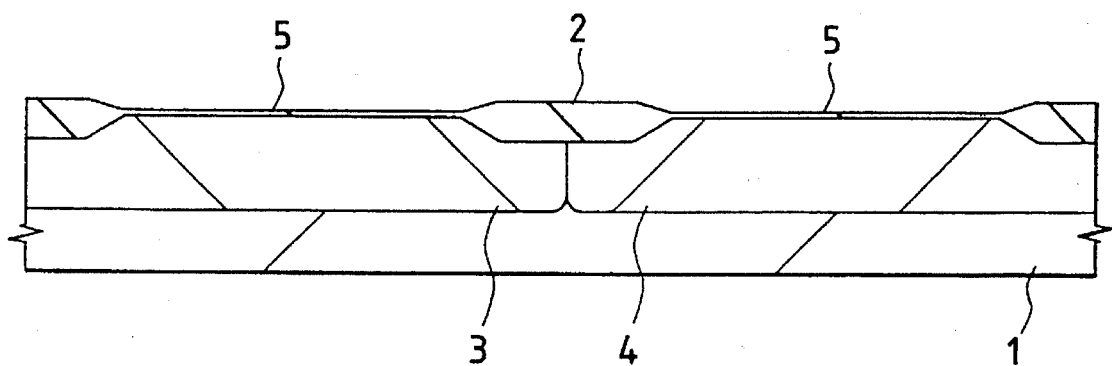

As shown in FIG. 1, a field insulating film 2 for isolating elements is first formed by a known selective oxidation process (LOCOS process) on the principal surface of a semiconductor substrate 1 formed of p-type silicon single crystal, for example. Then, as shown in FIG. 2, an n-type impurity (e.g., phosphorus) and a p-type impurity (e.g., boron) are introduced into an n-type well forming region and a p-type well forming region of the semiconductor substrate 1, respectively, by an ion implantation process, thereby forming an n-type well 3 and a p-type well 4. Then, thin gate insulating films 5 of silicon oxide are formed on the principal surfaces of active regions of the n-type well 3 and the p-type well 4.

Figure 3:
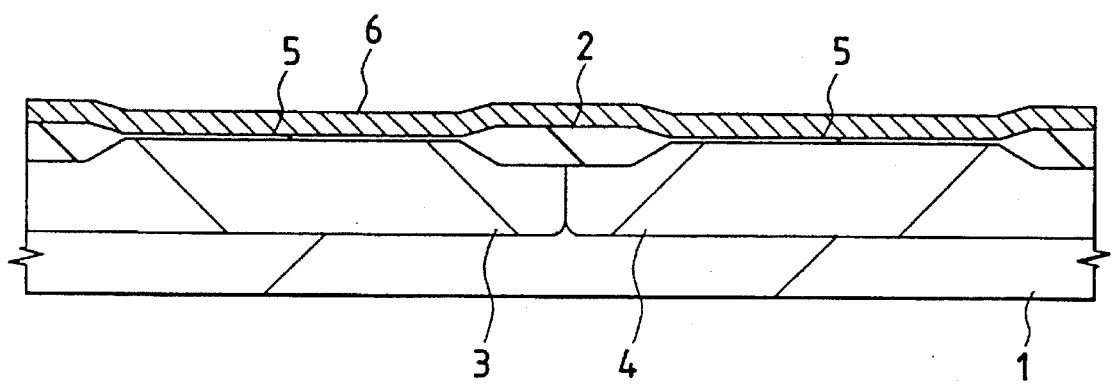

Then, as shown in FIG. 3, a polysilicon film 6 having a thickness of about 100 nm is deposited over the surface of the semiconductor substrate 1 by a CVD (Chemical Vapor Deposition) process. During or after the deposition of the polysilicon film 6, an n-type impurity (e.g., phosphorus) is introduced at a concentration of about $4\times10^{20}$ atoms/cm$^3$ into the polysilicon film 6. If the concentration of the n-type impurity in the polysilicon film 6 is low, a depletion layer is formed in the gate electrode when a positive voltage is applied to the gate electrode with the p-type well 4 grounded, so that the effective thickness of the gate insulating film is increased to decrease a drain current in the MISFET. To avoid the formation of the depletion layer, it is necessary to introduce the n-type impurity at the concentration of at least about $2\times10^{20}$ atoms/cm$^3$ or more into the polysilicon film 6.

Figure 4:
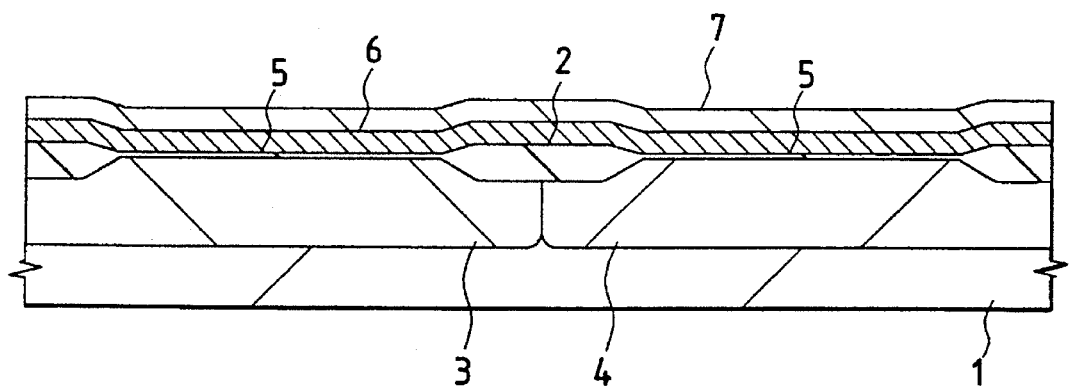

Then, as shown in FIG. 4, a polysilicon film 7 having a thickness of about 100 nm is deposited over the surface of the semiconductor substrate 1 by a CVD process. No n-type impurity is introduced into the polysilicon film 7. In the case that an n-type impurity is introduced into the polysilicon film 7, the concentration of the n-type impurity in the polysilicon film 7 is set lower than that in the polysilicon film 6.

If the concentration of the n-type impurity in the polysilicon film 7 is high, a silicide reaction in the interface between the polysilicon film 7 and a Ti film deposited thereon to be hereinafter described is hindered. The n-type impurity in the polysilicon film 6 formed under the polysilicon film 7 is somewhat diffused into the polysilicon film 7; therefore, when an n-type impurity is introduced into the polysilicon film 7, the concentration of the n-type impurity in the polysilicon film 7 must be set less than or equal to about $1\times10^{20}$ atoms/cm$^3$.

Figure 5:
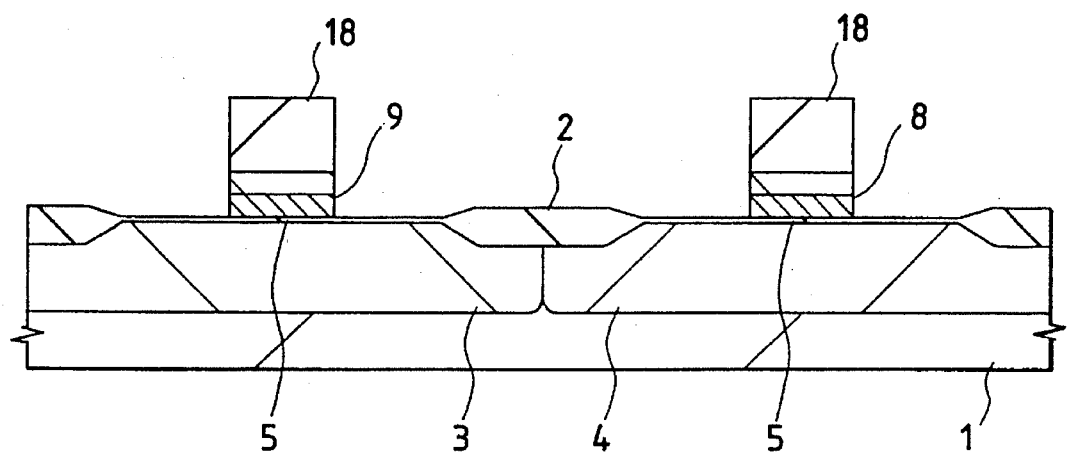

Then, as shown in FIG. 5, the two polysilicon films 6 and 7 are patterned by dry etching with a photoresist 18 as a mask, for example, to thereby form a gate electrode 8 of the n-channel MISFET on the principal surface of the p-type well 4 and a gate electrode 9 of the p-channel MISFET on the principal surface of the n-type well 3. The gate electrodes 8 and 9 are formed so that their gate lengths become 0.3 μm or less, for example.

In this manner, both the gate electrode 8 of the n-channel MISFET and the gate electrode 9 of the p-channel MISFET are constructed of a laminated film consisting of the polysilicon film 6 including a high concentration of n-type impurity and the polysilicon film 7 substantially excluding an n-type impurity or including a low concentration of n-type impurity. Accordingly, the concentration of the n-type impurity in the gate electrodes 8 and 9 is high on the gate oxide film 5 side and low on the surface side.

Figure 6:
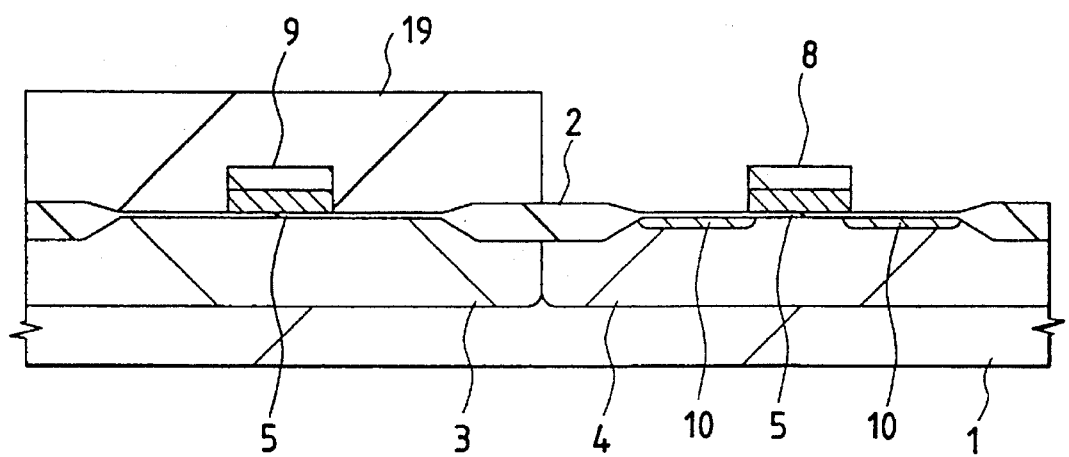

Then, as shown in FIG. 6, after removing the photoresist 18, an n-type impurity (e.g., phosphorus or arsenic) is introduced by an ion implantation process into the p-type well 4 with a photoresist 19 as a mask for covering the n-type well 3, thereby forming n-semiconductor regions 10 on the principal surface of the p-type well 4 on both sides of the gate electrode 8. The n$^-$ semiconductor regions 10 form a part of a source region and a part of a drain region in the n-channel MISFET.

Figure 7:
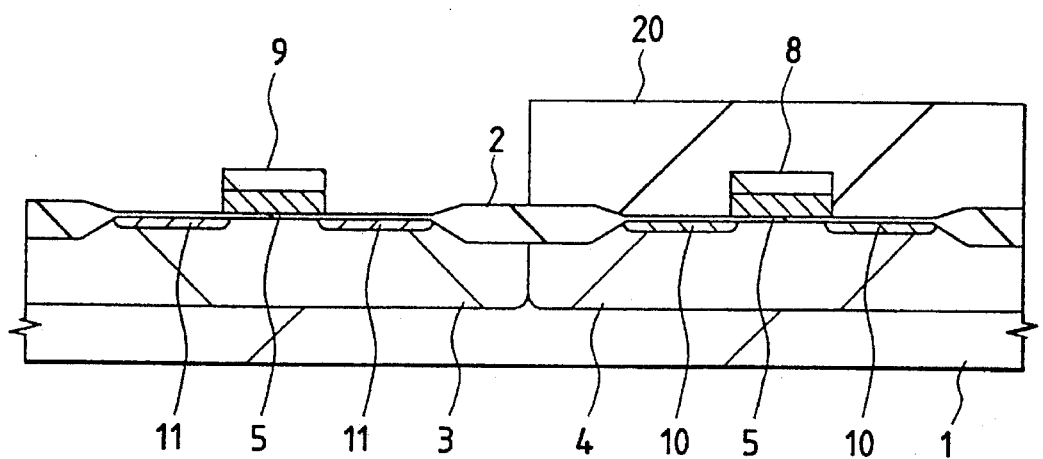

Then, as shown in FIG. 7, after removing the photoresist 19, a p-type impurity (e.g., boron) is introduced by an ion implantation process into the n-type well 3 with a photoresist 20 as a mask for covering the p-type well 4, thereby forming p$^-$ semiconductor regions 11 having a low impurity concentration on the principal surface of the n-type well 3 on both sides of the gate electrode 9. The p$^-$ semiconductor regions 11 form a part of a source region and a part of a drain region in the p-channel MISFET.

Figure 8:
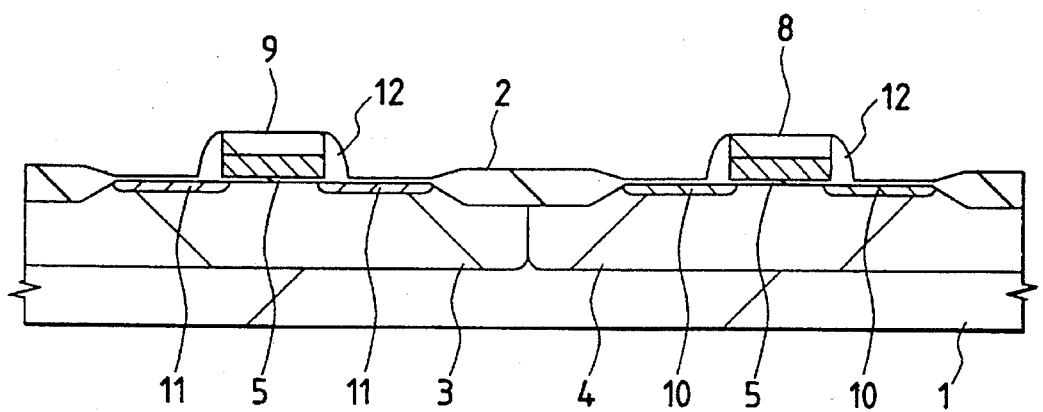

Then, as shown in FIG. 8, after removing the photoresist 20, a silicon oxide film is deposited over the surface of the semiconductor substrate 1 by a CVD process, and the silicon oxide film is anisotropically etched by using a reaction ion etching (RIE) process, thereby forming side wall spacers 12 on the side walls of the gate electrode 8 in the n-channel MISFET and the gate electrode 9 in the p-channel MISFET.

Figure 9:
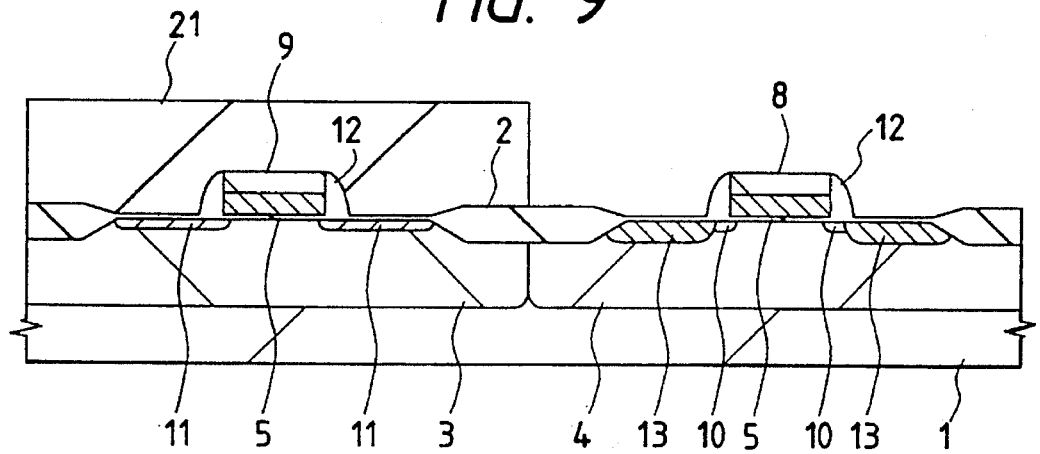

Then, as shown in FIG. 9, an n-type impurity (e.g., arsenic) is introduced by an ion implantation process into the p-type well 4 with a photoresist 21 as a mask for covering the n-type well 3, thereby forming n$^+$ semiconductor regions 13 having a high impurity concentration on the principal surface of the p-type well 4 on both sides of the gate electrode 8. The n$^+$ semiconductor regions 13 form a part of the source region and a part of the drain region in the n-channel MISFET.

Figure 10:
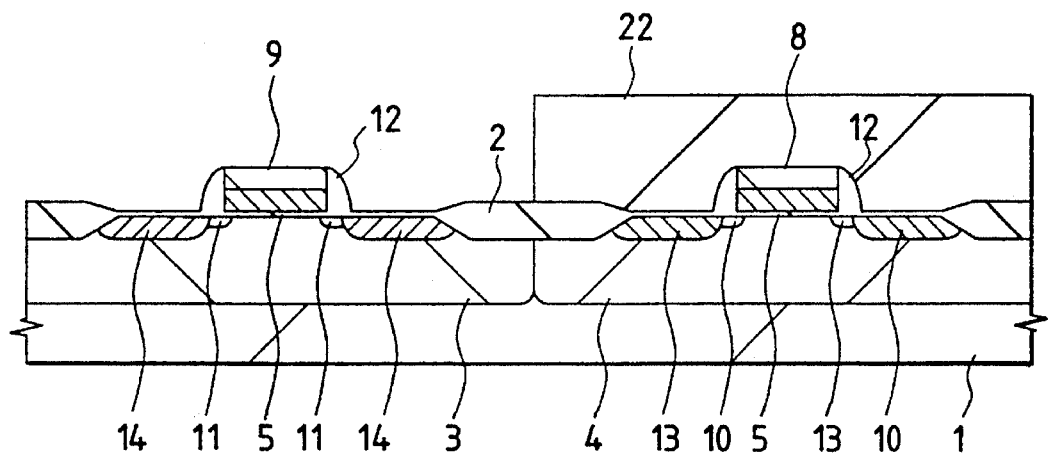

Then, as shown in FIG. 10, after removing the photoresist 21, a p-type impurity (e.g., boron) is introduced by an ion implantation process into the n-type well 3 with a photoresist 22 as a mask for covering the p-type well 4, thereby forming p$^+$ semiconductor regions 14 having a high impurity concentration on the principal surface of the n-type well 3 on both sides of the gate electrode 9. The p$^+$ semiconductor regions 14 form a part of the source region and a part of the drain region in the p-channel MISFET. Thus, the source and drain regions 10, 11, 13, and 14 having LDD (Lightly Doped Drain) structures are formed in the n-channel MISFET and the p-channel MISFET.

Figure 11:
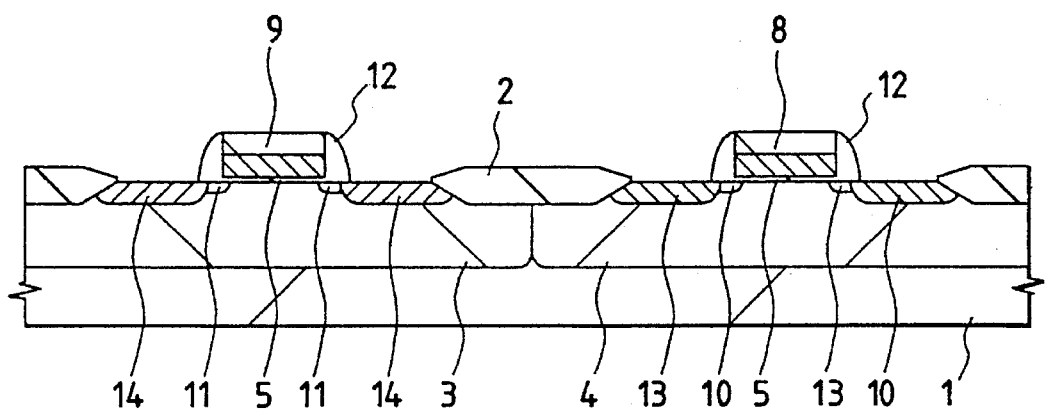

Then, as shown in FIG. 11, after removing the photoresist 22, the gate insulating films 5 on the n$^+$ semiconductor regions 13 (source and drain regions) in the n-channel MISFET and on the p$^+$ semiconductor regions 14 (source and drain regions) in the p-channel MISFET are removed by an etching liquid containing hydrofluoric acid, for example, thereby exposing the n$^+$ semiconductor regions 13 and the p$^+$ semiconductor regions 14. At the same time, natural oxide films on the surfaces of the gate electrodes 8 and 9 are also removed.

Figure 12:
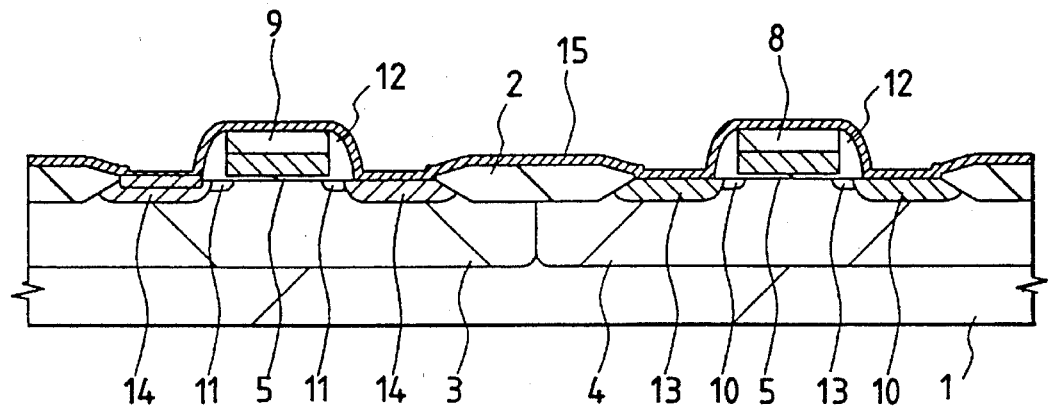

Then, as shown in FIG. 12, a Ti film 15 is deposited over the surface of the semiconductor substrate 1 by using a sputtering process. The thickness of the Ti film 15 is set less than or equal to the half of the thickness (about 100 nm) of the polysilicon film 7. For example, the thickness of the Ti film 15 is set to about 40 nm.

Figure 13:
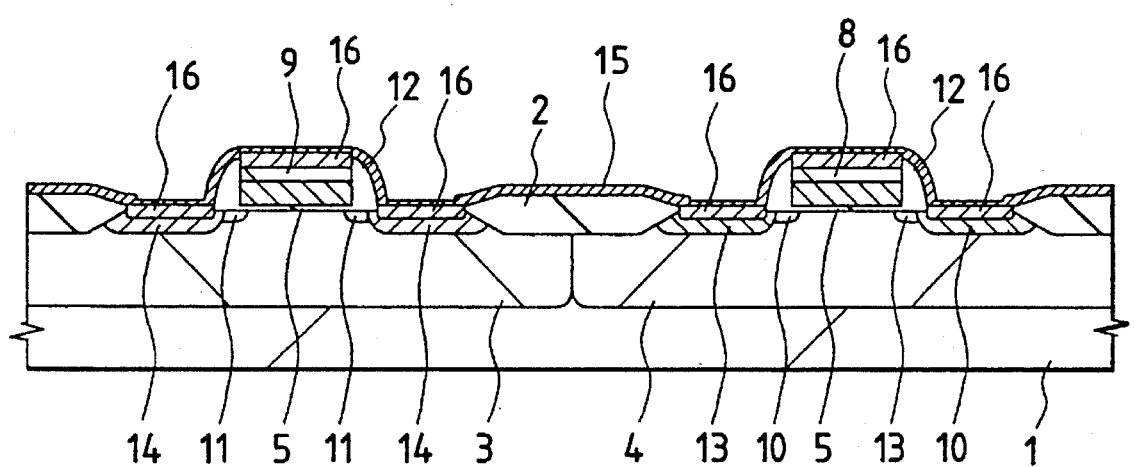

Then, as shown in FIG. 13, the semiconductor substrate 1 is annealed at a temperature of about 650° to 700° C. in an atmosphere of nitrogen gas (first annealing), thereby causing a silicide reaction in the interfaces between the gate electrodes 8 and 9 and the Ti film 15 and in the interfaces between the source and drain regions (the n$^+$ semiconductor regions 13 and the p$^+$ semiconductor regions 14) and the Ti film 15 (first silicide reaction) to form Ti silicide layers 16.

The Ti silicide layers 16 formed above are formed of Ti silicide (TiSi$_x$; x<2) having a sheet resistance (tens of Ω/sq). substantially equal to that of polysilicon including an n-type impurity at a high concentration. If the first annealing is performed at a temperature higher than about 700° C., the sheet resistance is further decreased; however, the silicon in the source and drain regions is attracted into the Ti film 15 to form the Ti silicide layers 16 also on the side wall spacers 12, with the result that the gate electrodes 8 and 9 and the source and drain regions (the n$^+$ semiconductor regions 13 and the p$^+$ semiconductor regions 14) are possibly short-circuited through the Ti silicide layers 16 on the side wall spacers 12. On the other hand, if the first annealing is performed at a temperature lower than about 650° C., the above-mentioned silicide reaction is not enough progressed to cause a problem that the Ti film 15 may be entirely removed in removing an unreacted portion of the Ti film 15 to be hereinafter described.

Figure 14:
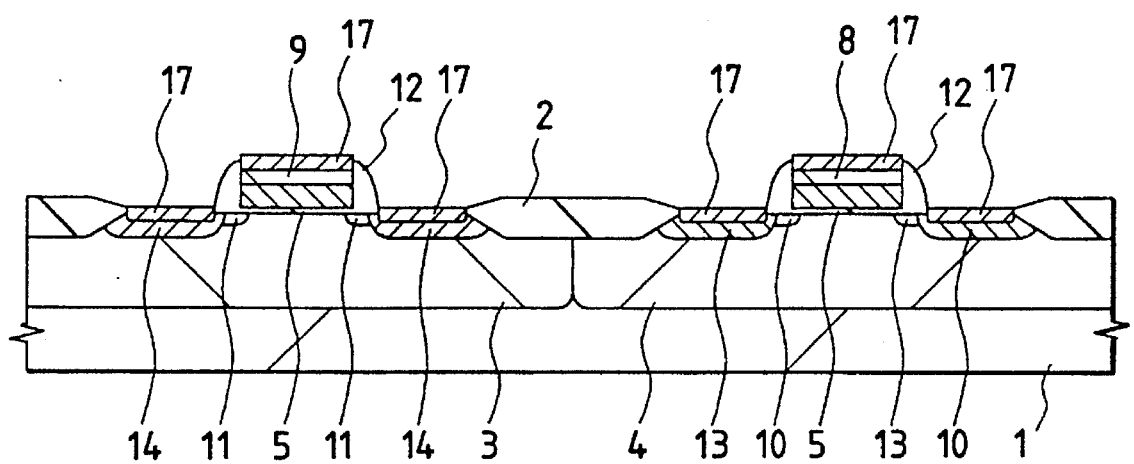

Then, as shown in FIG. 14, an unreacted portion of the Ti film 15 left on the field insulating film 2 and the side wall spacers 12 is removed by wet etching using an ammonia/hydrogen peroxide mixed aqueous solution, for example. Then, the semiconductor substrate 1 is annealed again at a temperature of about 850° to 900° C. in an atmosphere of nitrogen gas (second annealing) to further progress the above-mentioned silicide reaction, thereby converting the Ti silicide layer 16 into a Ti silicide layer 17 having a low sheet resistance (second silicide reaction). The sheet resistance of the Ti silicide layer 17 formed by the second annealing is 5 to 10 Ω/sq., which is lower than the sheet resistance (10 to 15 Ω/sq.) of a gate electrode having a polycide structure of a laminated film consisting of a polysilicon film and a high-melting point metal silicide film.

Figure 15A:
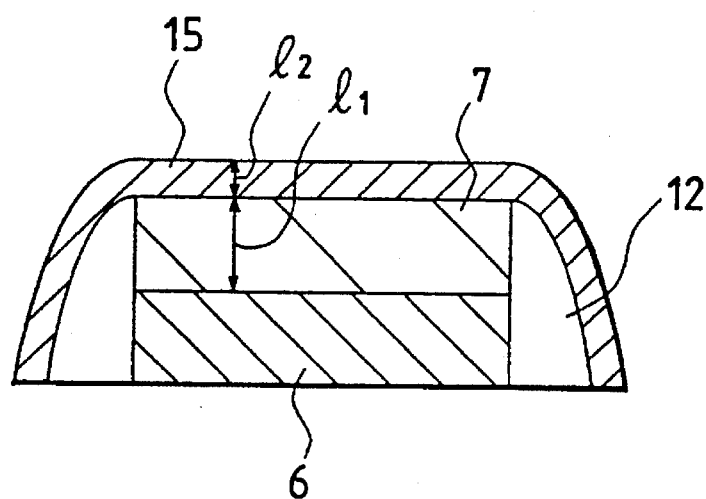
FIGS. 15A, 15B, and 15C are enlarged sectional views of a gate electrode, showing the manufacturing method for the semiconductor integrated circuit device according to the preferred embodiment.
Figure 15B:
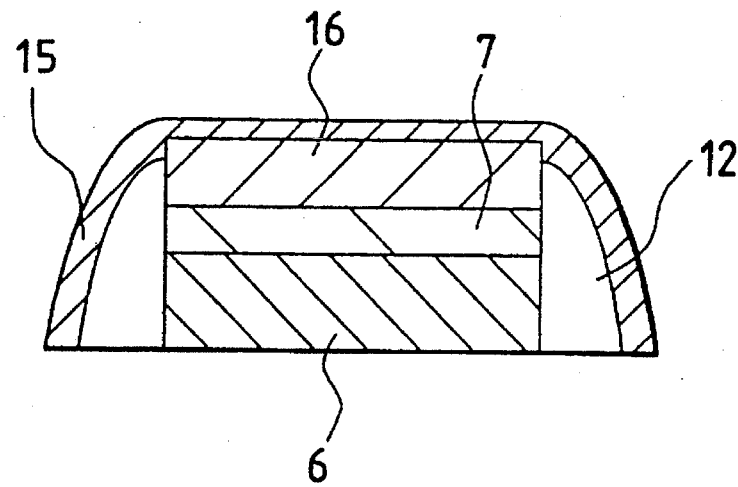
Figure 15C:
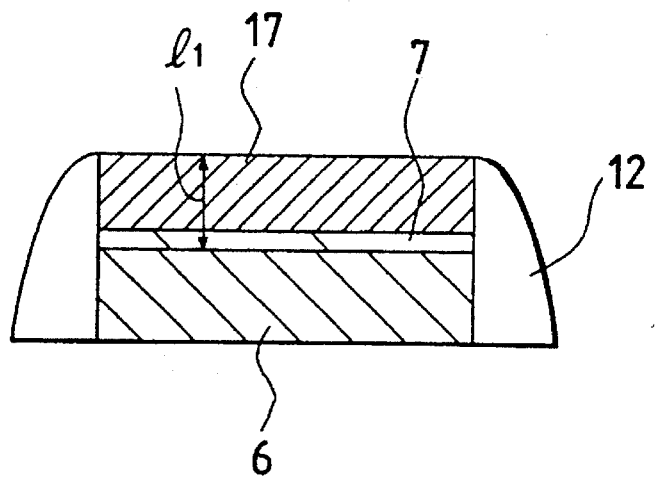

FIGS. 15A to 15C are enlarged sectional views of the gate electrode 8 or 9, showing a progressed condition of the above-mentioned silicide reaction. Specifically, FIG. 15A shows a condition where the Ti film 15 is deposited on the gate electrode 8 or 9, and FIG. 15B shows a condition where the Ti silicide layer 16 having a high sheet resistance is formed in the interface between the gate electrode 8 or 9 and the Ti film 15 by the first annealing. The first annealing causes a portion of the polysilicon film 7 of the gate electrode 8 or 9 on the surface side to be consumed by substantially the same thickness as that of the Ti film 15, thereby forming the Ti silicide film 16.

FIG. 15C shows a condition where the Ti silicide layer 17 having a low sheet resistance is formed by the second annealing. At this time, the polysilicon film 7 is consumed by the thickness twice that by the first annealing. Accordingly, the thickness $l_1$ of the polysilicon film 7 must be set twice or more of the thickness $l_2$ of the Ti film 15 (i.e., $l_1 \geq 2l_2$).

Figure 16A:
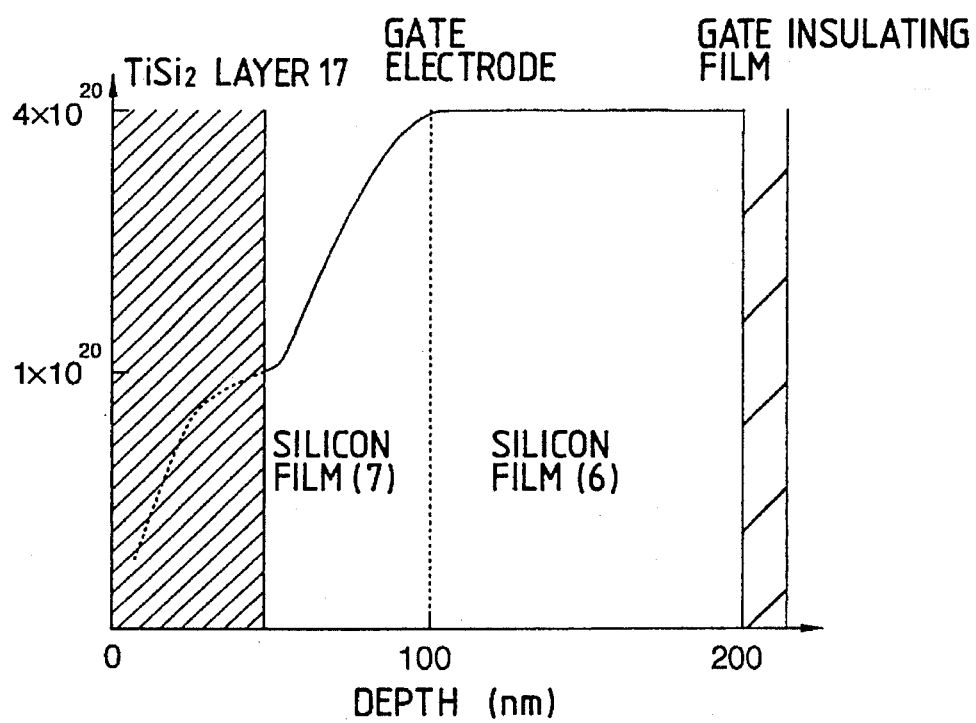
FIGS. 16A and 16B are graphs showing the concentration profiles of n-type impurities in polysilicon films forming the gate electrode.
Figure 16B:
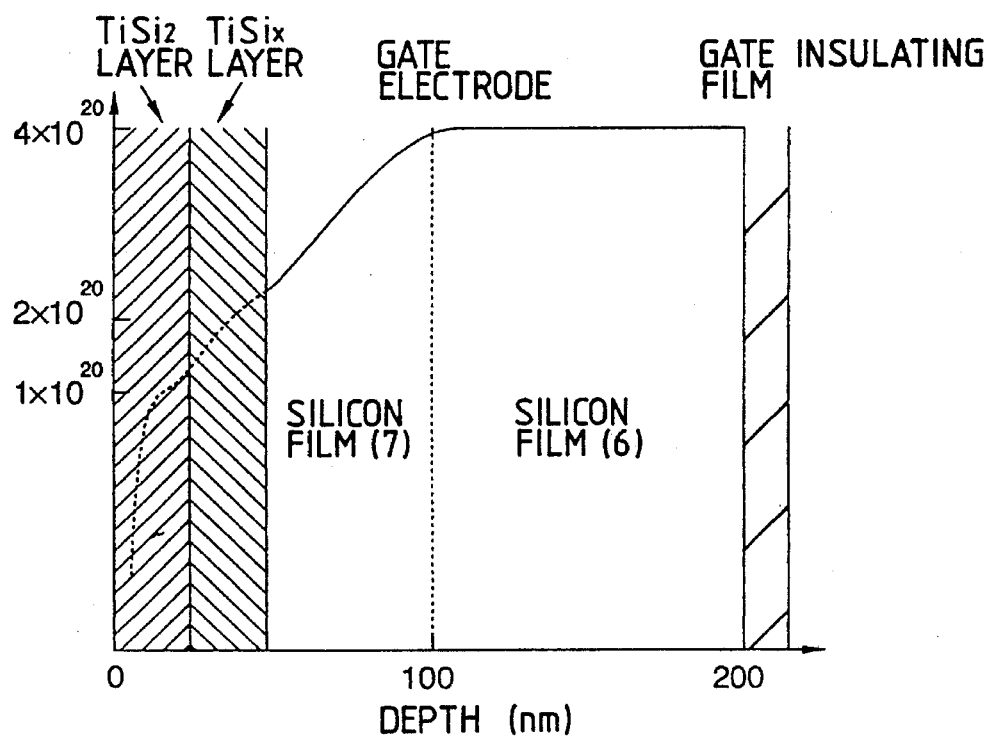
Figure 17:
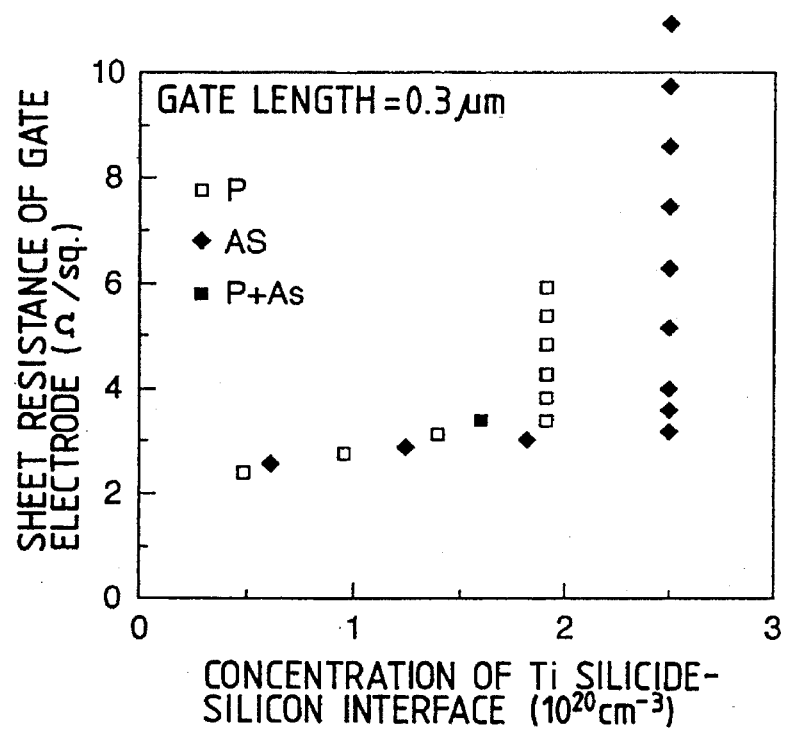
FIG. 17 is a graph showing the relation between the concentration of an n-type impurity in the interface between a polysilicon film and a Ti silicide layer and the sheet resistance of the gate electrode.

FIGS. 16A and 16B are graphs showing the concentration profiles of n-type impurities in the two-layer polysilicon films 6 and 7 forming each of the gate electrodes 8 and 9; and FIG. 17 is a graph showing the relation between the concentration of an n-type impurity (phosphorus and/or arsenic) in the interface between the polysilicon film 7 and the Ti silicide layer and the sheet resistance of the gate electrode 8 or 9.

In the first annealing, the n-type impurity in the polysilicon film 6 under the polysilicon film 7 forming each of the gate electrodes 8 and 9 is diffused into the polysilicon film 7 to some extent. When the concentration of the n-type impurity in the interface between the Ti silicide layer 17 and the polysilicon film 7 is less than about $2 \times 10^{20}$ atoms/cm$^3$ the second silicide reaction (TiSi$_x \rightarrow$TiSi$_2$) by the second annealing is enough progressed to form a TiSi$_x$ layer as shown in FIG. 16A, and the sheet resistance becomes less than 4 Ω/sq. To the contrary, if the thickness of the polysilicon film 7 is small and the concentration of the n-type impurity in the interface between the Ti silicide layer 17 and the polysilicon film 7 after the second annealing is greater than about $2 \times 1020$ atoms/cm$^3$, the progress of the second silicide reaction by the second annealing is not enough. As a result, the Ti silicide layer (TiSi$_x$) 16 is :Left in the interface as shown in FIG. 16B, and the sheet resistance becomes greater than 10 Ω/sq. as shown in FIG. 17. Therefore, the thickness of the polysilicon film 7 must be set so that the concentration of the impurity in the interface between the Ti silicide layer 17 and the polysilicon film 7 after the second annealing becomes less than or equal to $1 \times 10^{20}$ atoms/cm$^3$.

Figure 18:
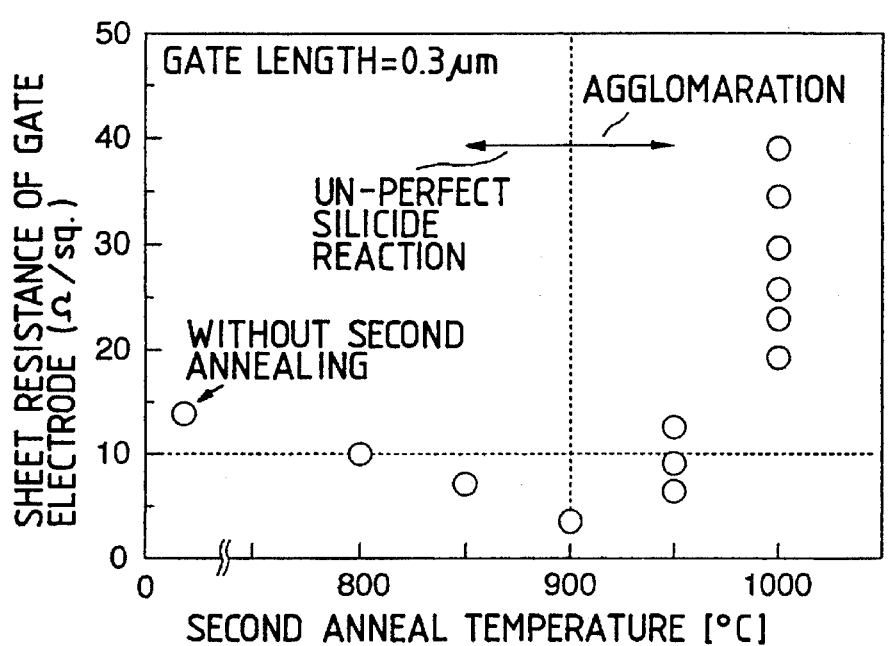
FIG. 18 is a graph showing the relation between the temperature of second annealing and the sheet resistance of the gate electrode.

FIG. 18 is a graph showing the relation between the second annealing temperature and the sheet resistance of the gate electrode 8 or 9.

As shown in FIG. 18, when the second annealing temperature is lower than 800° C. the progress of the second silicide reaction is not enough with the result that the sheet resistance of the gate electrode 8 or 9 becomes greater than 10 Ω/sq. Further, when the second annealing temperature is higher than 900° C. there occurs agglomeration in the Ti silicide layer 17 to cause variations in the sheet resistance and a gradual increase in value of the sheet resistance. Accordingly, the second annealing temperature must be set within the range of 800° to 900° C., preferably, 850° to 900° C.

Figure 19:
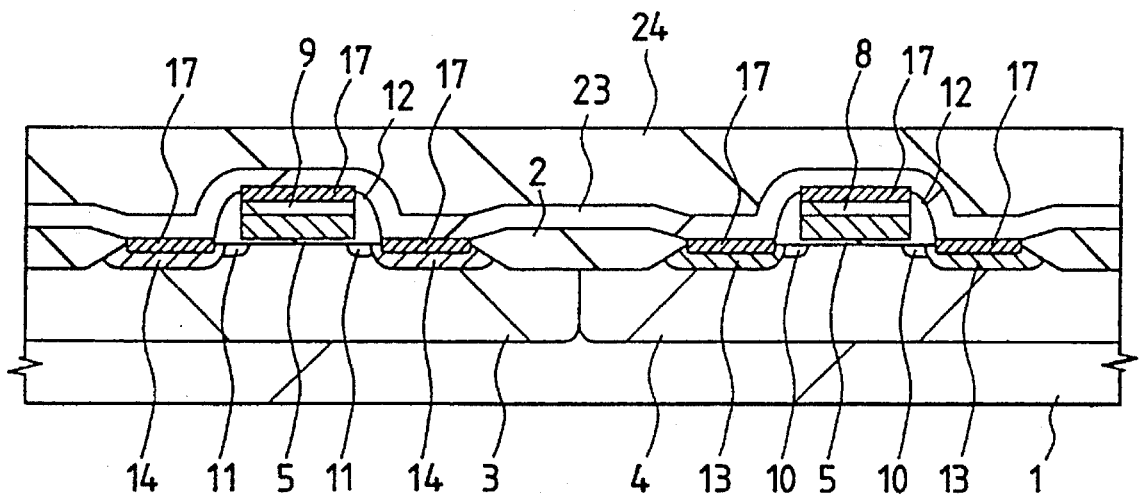

Then, as shown in FIG. 19, an insulating film 23 of silicon oxide is deposited over the surface of the semiconductor substrate 1 by a CVD process, and a BPSG (Boro Phospho Silicate Glass) film 24 is deposited on the insulating film 23 by a CVD process. Then, the semiconductor substrate 1 is subjected to a densify process at a temperature of about 900° C. The densify process allows the phosphorus (P) in the BPSG film 24 to be activated and the BPSG film 24 to trap metals such as Na having an adverse effect on the operation of the MISFET. The BPSG film 24 may be replaced by a PSG (Phospho Silicate Glass) film, for example, as an insulating film containing phosphorus (P).

Figure 21:
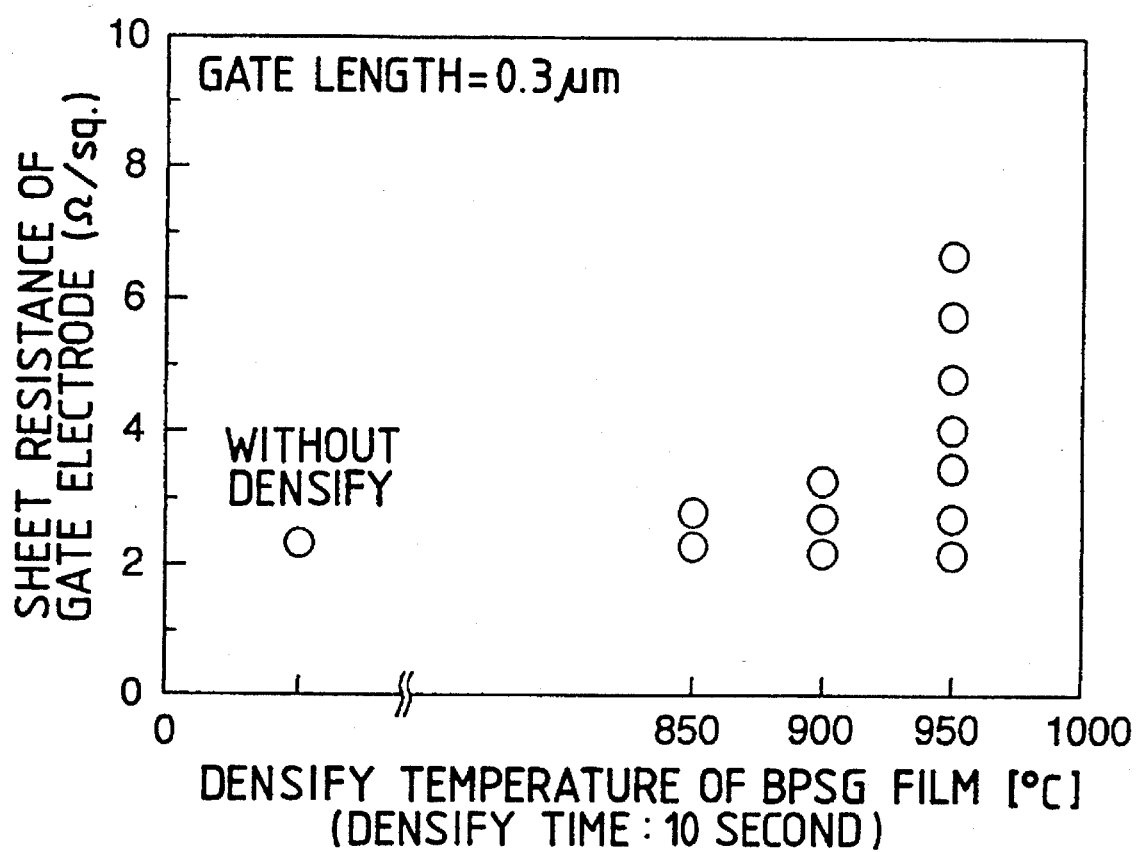
FIG. 21 is a graph showing the relation between the temperature of densification of a BPSG film and the sheet resistance of the gate electrode.

FIG. 21 shows a graph showing the relation between the densify temperature of the BPSG film 24 and the sheet resistance of the gate electrode 8 or 9.

As shown in FIG. 21, when the densify temperature is greater than about 900° C., there occurs agglomeration in the Ti silicide layer 17 to cause variations in the sheet resistance and a gradual increase in value of the sheet resistance. Accordingly, the densify temperature of the BPSG film 24 must be set within the range of 850° to 950° C., preferably at about 900° C.

Figure 20:
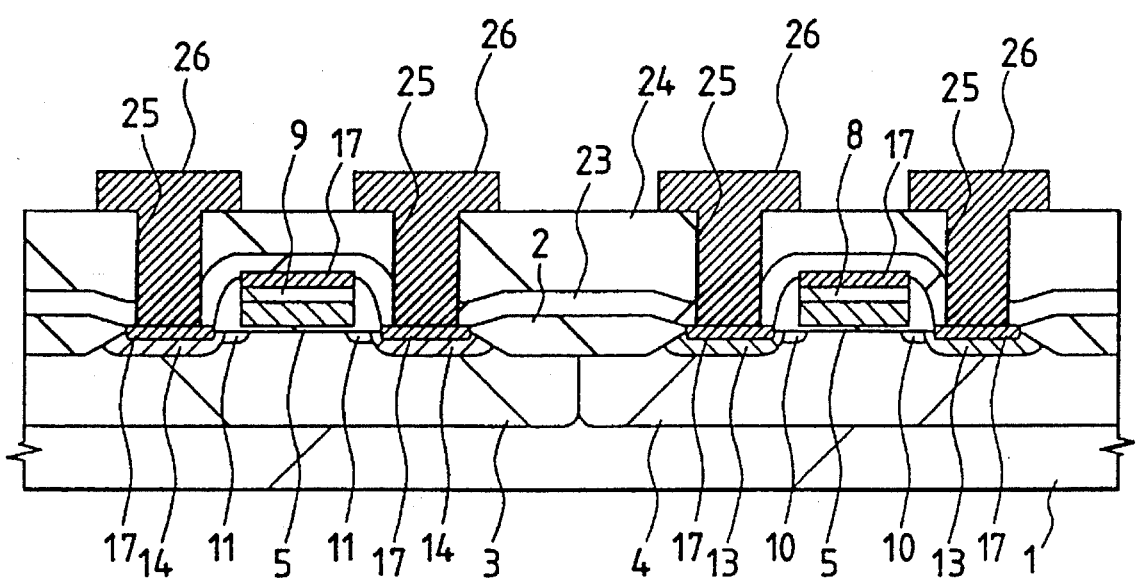

Then, as shown in FIG. 20, the BPSG film 24 and the insulating film 23 are etched to form connection holes 25 reaching the n$^+$ semiconductor regions 13 (Ti silicide layers 17) in the n-channel MISFET and the p$^+$ semiconductor regions 14 (Ti silicide layers 17) in the p-channel MISFET.

Then, a wiring 26 of aluminum, tungsten, etc. is formed on the BPSG film 24.

Having thus described a specific preferred embodiment of the present invention, it should be noted that the present invention is not limited to the above preferred embodiment, but various modifications may be made without departing from the scope of the present invention.

For instance, although the second annealing and the densifying of the BPSG film 24 are performed in different steps, these processes may be performed in a single step. That is, after forming the Ti silicide layer 16 having a high sheet resistance on each of the gate electrodes 8 and 9 by the first annealing, the insulating film 23 and the BPSG film 24 are deposited over the surface of the semiconductor substrate 1. Then, the semiconductor substrate 1 is annealed at a temperature of about 900° C. to perform a reduction in sheet resistance of the Ti silicide layer 16 and simultaneously perform the densifying of the BPSG film 24. In this case, the manufacturing steps of the MISFET can be shortened.

In the above preferred embodiment, the two-layer polysilicon films 6 and 7 forming each gate electrode are sequentially deposited by a CVD process. As a modification, the polysilicon film 6 containing phosphorus at a high concentration may be deposited to have a thickness of about 150 nm by using monosilane (SiH$_4$) and PH$_4$. Thereafter, the supply of PH$_4$ may be cut to further deposit the nondoped polysilicon film 7 having a thickness of about 150 nm by using only the monosilane.

In the above preferred embodiment, the manufacturing method of the present invention is applied to the complementary MISFET wherein the gate electrodes in the n-channel MISFET and the p-channel MISFET are formed from the n-type polysilicon films. As a modification, the present invention may be applied to a dual-gate type complementary MISFET wherein the gate electrode in the n-channel MISFET is formed from a n-type polysilicon film and the gate electrode in the p-channel MISFET is formed from a p-type polysilicon film.

In this case, a nondoped polysilicon film having a thickness of about 100 nm may be deposited over the surface of a semiconductor substrate by a CVD process. Then, an n-type impurity may be introduced into the polysilicon film in the n-channel MISFET and a p-type impurity may be introduced into the polysilicon film in the p-channel MISFET by using a photoresist as a mask. Then, a nondoped polysilicon film having a thickness of about 100 nm may be deposited over the surface of the semiconductor substrate by a CVD process. Then, the two-layer polysilicon films may be patterned to form the gate electrodes.

Although the Ti silicide layer is formed on each gate electrode in the above preferred embodiment, a layer of silicide of any other high-melting point metals (e.g., Pt, Co, Mo, W, Ta) may be formed.

The effects to be obtained by a typical method of the present invention will be described below.

(1) The concentration of the n-type impurity in the polysilicon film forming a surface side of the gate electrode in the MISFET is made low to thereby well promote the silicide reaction in the interface between the polysilicon film and the high-melting point metal film deposited thereon. Accordingly, the sheet resistance (ρs) of the gate electrode can be reduced.

(2) The concentration of the n-type impurity in the polysilicon film forming a gate insulating film side of the gate electrode in the MISFET is made high to thereby suppress the formation of a depletion layer in the gate electrode. Accordingly, an increase in effective thickness of the gate insulating film can be prevented to thereby prevent a decrease in drain current in the MISFET.

(3) Owing to the effects (1) and (2), a high-speed high-performance MISFET can be realized.

(4) Since the sheet resistance (ps) of the n-type gate electrode can be reduced by the effect (1), it is unnecessary to use a MISFET having a p-type gate electrode in a circuit region required to have a low resistance. Accordingly, an integrated circuit can be constructed by only the MISFET having the n-type gate electrode, thereby eliminating the need of a masking step for performing ion implantation of a p-type impurity. As a result, the manufacturing steps can be shortened.

What is claimed is:

1. A method of manufacturing a semiconductor device, comprising the steps of:
   (a) providing a semiconductor substrate with both a first silicon layer formed over a main surface of said substrate and a second silicon layer formed on said first silicon layer, said first silicon layer having an impurity concentration of n-type conductivity higher than that of said second silicon layer;
   (b) patterning said first silicon layer and said second silicon layer to form a gate electrode pattern in a MISFET;
   (c) depositing a first insulating film over said main surface after said step (b);
   (d) etching said first insulating film to form a side wall spacer on a side wall of said gate electrode pattern;
   (e) depositing a high-melting point metal film over said main surface, said gate electrode pattern, and said side wall spacer after said step (d);
   (f) performing first annealing to cause a silicide reaction between said second silicon layer having a shape of said gate electrode pattern and said high-melting point metal film and thereby form a first silicide layer in said second silicon layer;
   (g) removing an unreacted portion of said high-melting point metal film left on said main surface and said side wall spacer after said step (f); and
   (h) performing second annealing at a temperature higher than that of said first annealing after said step (g) to convert said first silicide layer into a second silicide layer having a resistance lower than that of said first silicide layer, said first silicon layer having an impurity concentration of $2 \times 10^{20}$ atoms/cm$^3$ or more, said second silicon layer having an impurity concentration of $1 \times 10^{20}$ atoms/cm$^3$ or less, an impurity concentration in an interface between said second silicide layer and said second silicon layer being $1 \times 10^{20}$ atoms/cm$^3$ or less.

2. A method according to claim 1, wherein the temperature of said first annealing is in the range of 650° to 700° C.; the temperature of said second annealing is in the range of 800° to 900° C.; said high-melting point metal film is a Ti film; and said second silicon layer has a thickness twice or more of a thickness of said high-melting point metal film.

3. A method according to claim 2, further comprising the step of:
   (i) depositing an interlayer insulating film containing phosphorus over said main surface after said step (g); wherein said second annealing is performed after said step (i), and said interlayer insulating film is densified by said second annealing.

4. A method according to claim 1, wherein said second silicide layer is formed in said second silicon layer.

5. A method of manufacturing a semiconductor device, comprising the steps of:
   (a) providing a semiconductor substrate with both a first silicon layer formed over a main surface of said substrate and a second silicon layer formed on said first silicon layer, said first silicon layer having an impurity concentration higher than that of said second silicon layer;
   (b) patterning said first silicon layer and said second silicon layer to form a gate electrode pattern in a MISFET;
   (c) depositing a first insulating film over said main surface after said step (b);
   (d) etching said first insulating film to form a side wall spacer on a side wall of said gate electrode pattern;
   (e) depositing a high-melting point metal (A) film over said main surface, said gate electrode pattern, and said side wall spacer after said step (d);
   (f) performing first annealing to cause a silicide reaction between said second silicon layer having a shape of said gate electrode pattern and said high-melting point metal film and thereby form a first silicide layer (ASi$_x$; x<2) in said second silicon layer;
   (g) removing an unreacted portion of said high-melting point metal film left on said main surface and said side wall spacer after said step (f); and
   (h) performing second annealing at a temperature higher than that of said first annealing after said step (g) to convert said first silicide layer into a second silicide layer (ASi$_2$) having a resistance lower than that of said first silicide layer, an impurity concentration in an interface between said second silicide layer and said second silicon layer being $1 \times 10^{20}$ atoms/cm$^3$ or less.

6. A method according to claim 5, wherein said first silicon layer has an n-type impurity concentration of $2 \times 0^{20}$ atoms/cm$^3$ or more; said second silicon layer has an n-type impurity concentration of $1 \times 10^{20}$ atoms/cm$^3$ or less; and said second silicide layer is formed in said second silicon layer.

7. A method according to claim 6, wherein said second silicon layer has a thickness twice or more of a thickness of said high-melting point metal film.

8. A method according to claim 6, wherein said high-melting point metal film is a Ti film.

9. A method according to claim 6, wherein the temperature of said first annealing is in the range of 850° to 700° C.

10. A method according to claim 6, wherein the temperature of said second annealing is in the range of 850° to 900° C.

11. A method of according to claim 10, further comprising the steps of:
   (i) depositing an interlayer insulating film containing phosphorus over said main surface after said step (h); and
   (j) densifying said interlayer insulating film.

12. A method according to claim 10, wherein said gate electrode pattern having said second silicide layer has a sheet resistance of 10 Ω/sq. or less.

13. A method according to claim 6, further comprising the step of:
   (i) depositing an interlayer insulating film containing phosphorus over said main surface after said step (g); wherein said interlayer insulating film is densified by said second annealing, and simultaneously said first silicide layer is reduced in its resistance by said second annealing.

14. A method according to claim 5, wherein said second silicon layer has an impurity concentration of $1\times10^{20}$ atoms/cm$^3$ or less.

15. A method according to claim 14, wherein said second silicon layer has a thickness twice or more of a thickness of said high-melting point metal film.

16. A method according to claim 5, wherein said second silicon layer has a thickness twice or more of a thickness of said high-melting point metal film.

17. A method according to claim 5, wherein said high-melting point metal film is made of a metal selected from a group consisting of Ti, Pt, Co, Mo, W and Ta.

18. A method of manufacturing a semiconductor device, comprising the steps of:
   (a) providing a first semiconductor substrate with both a first silicon layer formed over a main surface of said substrate and a second silicon layer formed over said first silicon layer, said second silicon layer having an impurity concentration lower than that of said first silicon layer, a gate electrode pattern of a MISFET being constituted by said first and second silicon layers;
   (b) forming side wall spacers on side surfaces of said first and second silicon layers, said side wall spacers being made of an insulating material;
   (c) forming a high-melting point metal film over said main surface, said second silicon layer and said side wall spacers;
   (d) performing a first annealing to cause a silicide reaction between said second silicon layer and said high-melting point metal film and thereby form a first silicide layer within said second silicon layer such that said first silicide layer does not reach said first silicon layer, said second silicon layer having an impurity concentration of $1\times10^{20}$ atoms/cm$^3$ or less;
   (e) removing an unreacted portion of said high-melting point metal film left on said main surface and said side wall spacers after step (d); and
   (f) performing a second annealing at a temperature higher than that of said first annealing after said step (e) to convert said first silicide layer to a second silicide layer having a resistance lower than that of said first silicide layer.

19. A method according to claim 18, wherein an impurity concentration in an interface between said second silicide layer and said second silicon layer is $1\times10^{20}$ atoms/cm$^3$ or less.

20. A method according to claim 19, wherein said second silicide layer is formed within said second silicon layer.

21. A method according to claim 20, wherein the temperature of said first annealing is in the range of 650° to 800° C., and wherein the temperature of said second annealing is in the range of 850° to 900° C.

22. A method of manufacturing a semiconductor device, comprising the steps of:
   (a) providing a first semiconductor substrate with both a first silicon layer formed over a main surface of said substrate and a second silicon layer formed over said first silicon layer, said second silicon layer having an impurity concentration lower than that of said first silicon layer, a gate electrode pattern of an MISFET being constituted by said first and second silicon layers;
   (b) forming a high-melting point metal film over said main surface and said second silicon layer;
   (c) performing a first annealing to cause a silicide reaction between said second silicon layer and said high-melting point metal film and thereby form a first silicide layer within said second silicon layer such that said first silicide layer does not reach said first silicon layer, said second silicon layer having an impurity concentration of $1\times10^{20}$ atoms/cm$^3$ or less;
   (d) removing an unreacted portion of said high-melting point metal film left on said main surface after step (c); and
   (e) performing a second annealing at a temperature higher than that of said first annealing after said step (d) to convert said first silicide layer to a second silicide layer having a resistance lower than that of said first silicide layer.

23. A method of manufacturing a semiconductor device according to claim 22, wherein an impurity concentration in an interface between said second silicide layer and said second silicon layer is $1\times10^{20}$ atoms/cm$^3$ or less.

24. A method of manufacturing a semiconductor device according to claim 23, wherein said second silicide layer is formed within said second silicon layer.

* * * * *